(12) United States Patent
Deng et al.

(10) Patent No.: US 12,314,118 B2
(45) Date of Patent: May 27, 2025

(54) CIRCUIT PREVENTING SUPPLY OF POWER TO BOARD INCORRECTLY OR UNSTABLY INSTALLED, METHOD, AND SERVER SYSTEM

(71) Applicant: Shenzhen Fulian Fugui Precision Industry Co., Ltd., Shenzhen (CN)

(72) Inventors: Zhi-Yu Deng, Shenzhen (CN); Li-Wen Guo, Shenzhen (CN); Wen-Xiao Lu, Shenzhen (CN)

(73) Assignee: Shenzhen Fulian Fugui Precision Industry Co., Ltd., Shenzhen (CN)

( * ) Notice: Subject to any disclaimer, the term of this patent is extended or adjusted under 35 U.S.C. 154(b) by 440 days.

(21) Appl. No.: 17/869,938

(22) Filed: Jul. 21, 2022

(65) Prior Publication Data
US 2023/0299545 A1 Sep. 21, 2023

(30) Foreign Application Priority Data
Mar. 21, 2022 (CN) .......................... 202210280332.4

(51) Int. Cl.
*G06F 11/00* (2006.01)
*G01R 31/55* (2020.01)
*G06F 13/40* (2006.01)

(52) U.S. Cl.
CPC .............. *G06F 11/00* (2013.01); *G01R 31/55* (2020.01); *G06F 13/4068* (2013.01)

(58) Field of Classification Search
CPC ..................................................... G02B 27/48
See application file for complete search history.

(56) References Cited

U.S. PATENT DOCUMENTS

| 7,519,756 | B2 * | 4/2009 | Yamamoto | ............ G06F 13/387 |
| | | | | 710/10 |
| 8,010,820 | B1 * | 8/2011 | Gilbrech | ................. G06F 1/266 |
| | | | | 713/340 |

FOREIGN PATENT DOCUMENTS

TW 200506615 A 2/2005

* cited by examiner

*Primary Examiner* — Henry Tsai
*Assistant Examiner* — Juanito C Borromeo
(74) *Attorney, Agent, or Firm* — ScienBiziP, P.C.

(57) ABSTRACT

A board mis-insertion prevention circuit includes a first detection circuit, a second detection circuit, and a control module. The first detection circuit detects whether a board is in a first state and outputs a first detection signal when the board is in the first state. The second detection circuit detects whether the board is in a second state when the board is not in the first state, and outputs a second detection signal when the board is in the second state. The control module receives the first detection signal or the second detection signal and can allow or disconnect a power supply to the board according to the first detection signal or the second detection signal.

14 Claims, 6 Drawing Sheets

CIRCUIT PREVENTING SUPPLY OF POWER TO BOARD INCORRECTLY OR UNSTABLY INSTALLED, METHOD, AND SERVER SYSTEM

TECHNICAL FIELD

The present disclosure relates to the technical field of safety circuits, in particular to a board mis-insertion prevention circuit and method, and server system.

BACKGROUND

A server system can include the motherboard, the connector, and various boards. Various boards can be connected to the motherboard through the connectors, and some different types of the boards can only be connected to the corresponding connectors. If the type of the boards does not match the type of the connectors, it may cause server system failure or board burnout.

Therefore, improvement is desired.

DETAILED DESCRIPTION

The technical solutions in the embodiments of the present disclosure will be described in conjunction with the accompanying drawings in the embodiments of the present disclosure. Obviously, the described embodiments are part of the embodiments of the present disclosure, not all of them. Based on the embodiments of the present disclosure, all other embodiments obtained by those of ordinary skill in the art without creative work shall fall within the protection scope of the present disclosure. The terms used in the description of the present disclosure herein are only for the purpose of describing specific embodiments and are not intended to limit the present disclosure.

In the embodiment of the present disclosure, "first", "second" and other terms are only used for the purpose of distinguishing between descriptions and cannot be understood as indicating or implying relative importance, or as indicating or implying order. The features defined as "first" and "second" may include one or more of the features explicitly or implicitly. In the description of the embodiments of the present disclosure, the terms "exemplary" or "for example" are used as examples or explanations. Any embodiment or design described as "exemplary" or "for example" in the embodiments of the present disclosure shall not be interpreted as being more preferred or advantageous than other embodiments or designs.

Figure 1:
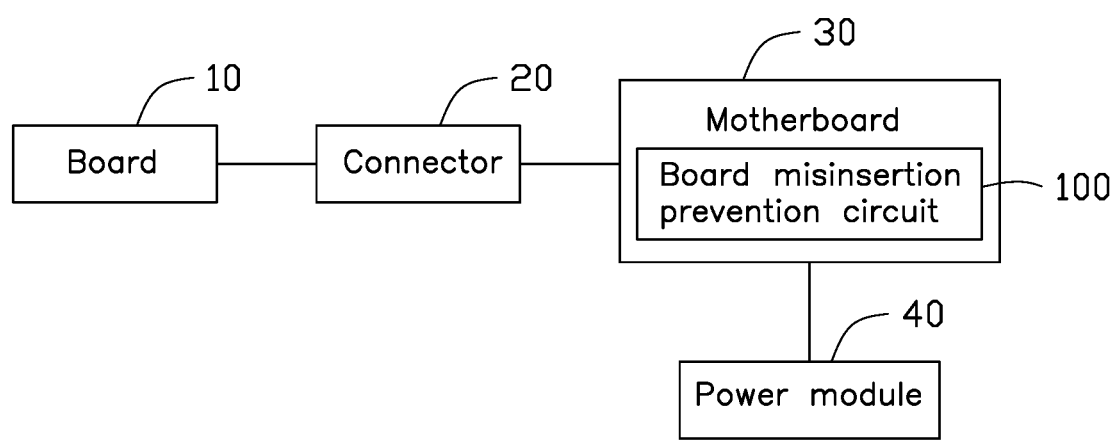
FIG. 1 is a schematic diagram of a server system according to an embodiment of the present disclosure.

FIG. 1 illustrates a server system 1 in accordance with an embodiment of the present disclosure.

The server system 1 includes a board 10, a connector 20, a motherboard 30, and a power module 40.

The board 10 is electrically connected to the connector 20, the connector 20 is electrically connected to the motherboard 30, and the motherboard 30 is electrically connected to the power module 40. In one embodiment, the power module 40 may be a power supply.

The power module 40 is used to supply power to the motherboard 30 and the board 10. The motherboard 30 can be configured in the server to manage and control the operation of the server. The motherboard 30 is connected to the board 10 through the connector 20.

The board 10 is used to control the functions of the motherboard 30. For example, the board 10 can include a first type of board and the second type of board. The first type of the board includes the data center ready secure control module (DC-SCM), which further includes a baseboard manager controller (BMC) used to monitor the overall status information of the server, a BMC flash memory used to store the firmware of BMC, a complex programming logic device (CPLD) used for logic control and information interaction with the motherboard 30, and a trusted platform module (TPM) used for server security.

The second type of the board includes boards designed based on the open compute project (OCP) standard, which further includes OCP network interface board (OCP NIC) version 3.0, which is used to provide a network interface for the motherboard 30, so that the motherboard 30 can connect to the network through OCP NIC 3.0.

The motherboard 30 is also provided with a board mis-insertion prevention circuit 100. The board mis-insertion prevention circuit 100 is used to detect the type of board 10 which is inserted and whether the board 10 which is connected through the connector 20 is correct in relation to the motherboard 30.

For different types of the board 10 and different insertion methods, the motherboard 30 can control the power module 40 to turn on or off the power supply to the board 10, so as to prevent the wrong type of the board 10 being connected to run in the server system 1. The wrong insertion and other abnormalities, the board 10 not working normally, or even burnout are also prevented. Therefore, the board mis-insertion prevention circuit 100 can detect whether the board 10 is correct and is correctly inserted into the motherboard 30 through the connector 20.

Figure 2:
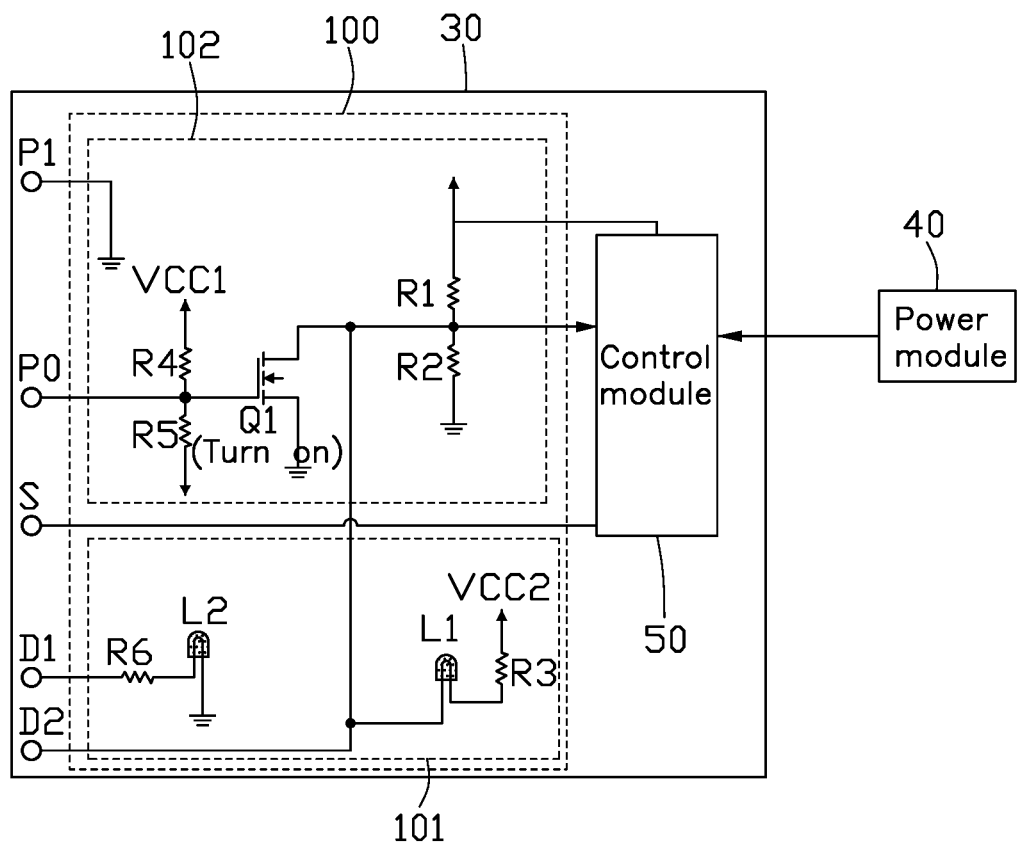
FIG. 2 is a schematic diagram of a board mis-insertion prevention circuit according to an embodiment of the present disclosure.

FIG. 2 illustrates a board mis-insertion prevention circuit 100 in accordance with an embodiment of the present disclosure.

The board mis-insertion prevention circuit 100 includes a first detection circuit 101 and a second detection circuit 102.

The first detection circuit 101 includes a resistor R1, a resistor R2, a resistor R4, a resistor R5, a switch Q1, a first port P1 and a second port P0. The second detection circuit 102 includes a light emitting module L1, a light emitting module L2. Both the light emitting module L1 and the light emitting module L2 are light-emitting diodes (LEDs).

In the embodiment, the motherboard 30 is also provided with a control module 50, the control module 50 is electrically connected to the power module 40. The control module 50 is used to convert the first power signal output by the power module 40 into a second power signal and output the second power signal to the board 10 through the third port S to supply power to the board 10. In one embodiment, the control module 50 may be a controller.

The first end of the resistor R1 receives the first voltage VCC1, and the first end of the resistor R1 is electrically connected to the first end of the control module 50. The second end of the resistor R1 is grounded through the resistor R2. The second end of the resistor R1 is electrically connected to the second end of the control module 50, the first end of the switch Q1, the cathode of the light emitting module L1, and the fifth port D2. The second end of the switch Q1 is grounded, and the third end of the switch Q1 is electrically connected to the second port P0, the first end of the resistor R4, and the first end of the resistor R5. The second end of the resistor R4 receives the first voltage VCC1, the second end of the resistor R5 is grounded, the anode of the light emitting module L1 is electrically connected to first end of the resistor R3, the second end of the resistor R3 receives the second voltage VCC2, the first port P1 is grounded, and the third port S is electrically connected to the third end of the control module 50. The fourth port D1 is electrically connected to the first end of the resistor R6, the second end of the resistor R6 is electrically connected to the anode of the light emitting module L2, and the cathode of the light emitting module L2 is grounded.

In the embodiment, the first voltage VCC1 and the second voltage VCC2 can be provided by an external power supply or by the power module 40. The first voltage VCC1 and the second voltage VCC2 can be equal. The switch Q1 is an NMOS tube, the first end of the switch Q1 is the drain of the switch Q1, the second end of the switch Q1 is the source of the switch Q1, and the third end of the switch Q1 is the gate of the switch Q1. In other embodiments, the switch Q1 can be simple switches, triodes, or other switching elements. The present disclosure does not limit the type and structure of the switch Q1.

The first detection circuit 101 is used to detect the type of the board 10. The first detection circuit 101 can determine whether the board 10 is of the second type through the voltage level of the fifth port D2. The board 10 of the second type is grounded at the position corresponding to the fifth port D2. If the board 10 of the second type is stably inserted into the connector 20, the voltage level of the fifth port D2 is low, and the first detection circuit 101 determines that the board 10 of the second type is stably inserted according to the low voltage level of the fifth port D2.

The second detection circuit 102 is used to detect whether a board 10 is inserted into the connector 20. The second detection circuit 102 can determine when a board 10 is inserted into the connector 20 and whether the board 10 is of the first type through the voltage level of the second port P0. Before any board 10 is inserted, the positions of the first type of the board 10 corresponding to the fourth port D1 and the fifth port D2 are suspended. When the state of the fifth port D2 is suspended, the first detection circuit 101 cannot determine whether a board 10 is inserted into the connector 20 or whether the board 10 which is connected into the connector 20 is of the first type or the second type.

The position of the board 10 of the second type corresponds to the second port P0 being electrically connected to the first port P1. When the board 10 of the second type is stably inserted into the connector 20, the voltage level of the second port P0 is low, but if the board 10 is not inserted or the insertion is unstable, the state of the second port P0 is suspended. The second detection circuit 102 can detect whether a board 10 is not inserted into the connector 20 or if the insertion is unstable, or whether the board 10 of the first type is stably inserted into the connector 20.

If the first detection circuit 101 detects that the board 10 of the second type is inserted, the first detection circuit 101 outputs the first detection signal to the second end of the control module 50. If the first detection circuit 101 does not detect the insertion of the board 10 of the second type, and the second detection circuit 102 detects that the board 10 is not inserted or that the insertion is unstable, and the second detection circuit 102 outputs a second detection signal to the second end of the control module 50. If the first detection circuit 101 does not detect the insertion of the board 10 of the second type, and the second detection circuit 102 detects the insertion of the board 10 of the second type, the second detection circuit 102 outputs a third detection signal to the second end of the control module 50. The control module 50 converts the first power into the second power according to the third detection signal, and outputs the second power to the board 10 through the third port s to supply power to the board 10.

Figure 3:
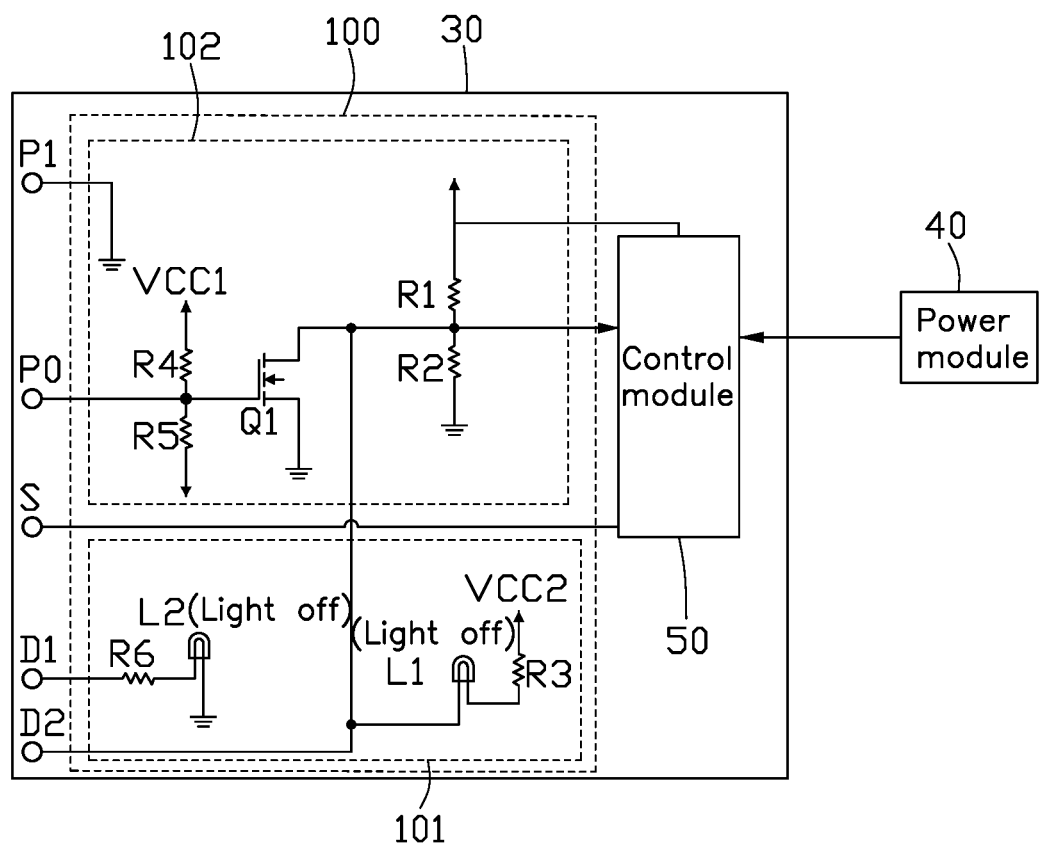
FIG. 3 is a schematic diagram of the board mis-insertion prevention circuit before insertion of the board according to an embodiment of the present disclosure.

FIG. 3 show the operation of the board mis-insertion prevention circuit 100 before the board 10 is inserted. Before the board 10 is inserted, the first port P1, the second port P0, the fourth port D1, and the fifth port D2 are not turned on, the states of the first port P1, the second port P0, the fourth port D1, and the fifth port D2 are suspended, and the light emitting modules L1 and L2 are turned off. The voltage at the third end of the switch Q1 is pulled up to the first voltage VCC1 by the resistor R4, the switch Q1 is turned on, and the voltage at the first end of the switch Q1 is pulled down to ground. The second detection circuit 102 outputs a second detection signal of low level from the first end of the switch Q1, and the control module 50 does not output the second power, disconnecting the power module 40 from the board 10.

When the board 10 of the first type is inserted into the connector 20, if the board 10 of the first type is inserted askew and not stably, the electrical connection between the first port P1 and the second port P0 is disconnected, and the state of the second port P0 is suspended. The second detection circuit 102 is regarded as the board 10 not being inserted, which can effectively solve the problem of the control module 50 continuing to supply power to the board 10 when the board 10 is inserted askew or unstable, resulting in damage or abnormal working of the board 10.

Figure 4:
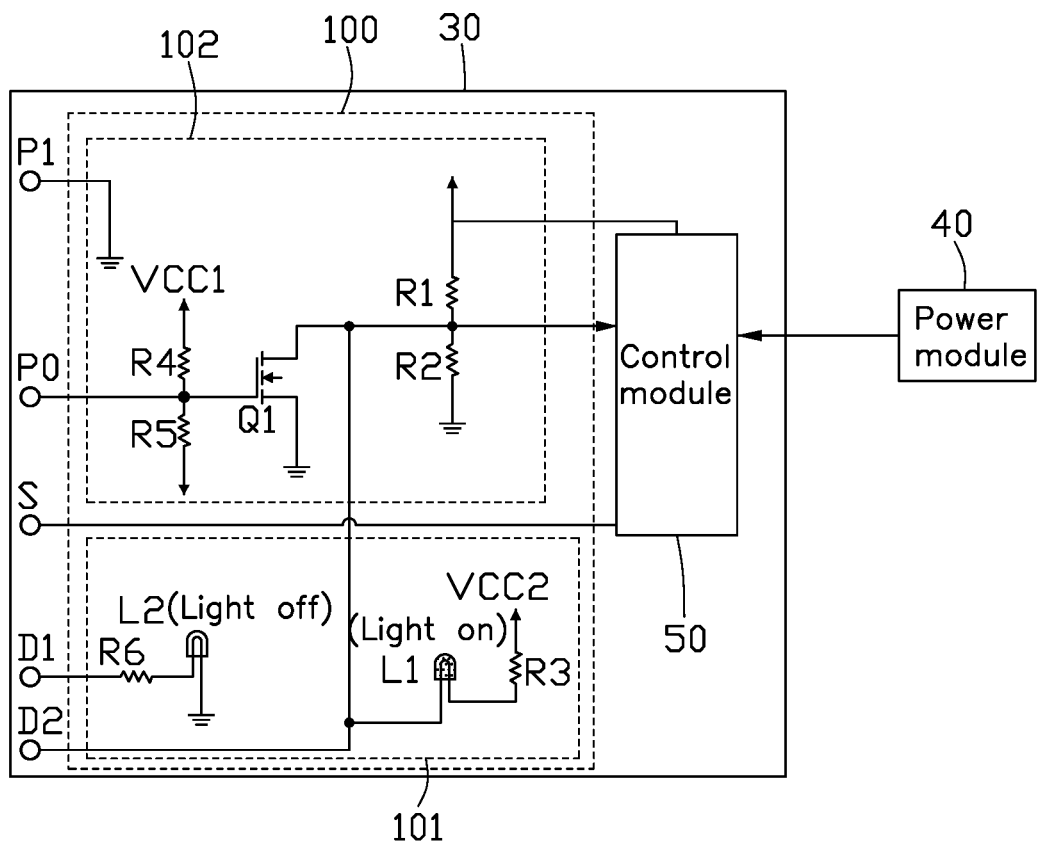
FIG. 4 is a schematic diagram of the board mis-insertion prevention circuit functioning in respect of a second type of board.

FIG. 4 shows the operation of the board mis-insertion prevention circuit 100 when the board 10 of the second type is inserted. When the board 10 of the second type is inserted, the fifth port D2 is grounded, the voltage level at the fifth port D2 is low, and the light emitting module L1 is on. The first detection circuit 101 outputs a first detection signal of low level, and the control module 50 does not output a second power, disconnecting the power module 40 from the board 10.

Figure 5:
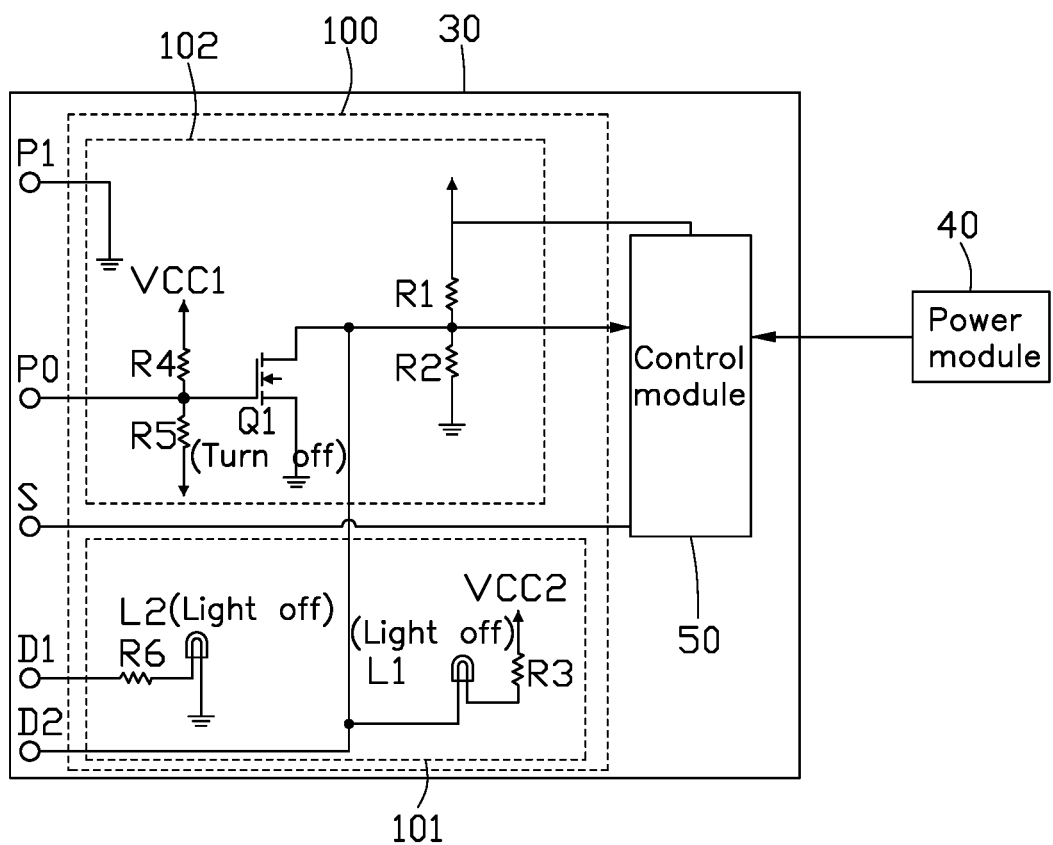
FIG. 5 is a schematic diagram of the board mis-insertion prevention circuit functioning in respect of a first type of board

FIG. 5 shows the operation of the board mis-insertion prevention circuit 100 when the board 10 of the first type is inserted. When the board 10 of the first type is inserted, the second port P0 is electrically connected to the first port P1, the voltage level of the second port P0 is low, the voltage at the third end of the switch Q1 is low, the switch Q1 is turned off, and the voltage at the first end of the switch Q1 is pulled up to the first voltage VCC1 by the resistor R1. The second detection circuit 102 outputs a third detection signal of high level from the first end of the switch Q1, and the control module 50 outputs a second power according to the third detection signal, so that the power module 40 supplies power to the board 10.

The board mis-insertion prevention circuit 100 of the present disclosure can detect a board 10 being connected, the stable or non-stable connection to a board 10 which is connected, and whether the board 10 which is connected is a correct board 10. Different detection signals are output according to the connection, so that the motherboard 30 controls the power module 40 to supply power or not to supply power to the board 10 according to the detection signal, so as to allow normal running of the server system 1.

Figure 6:
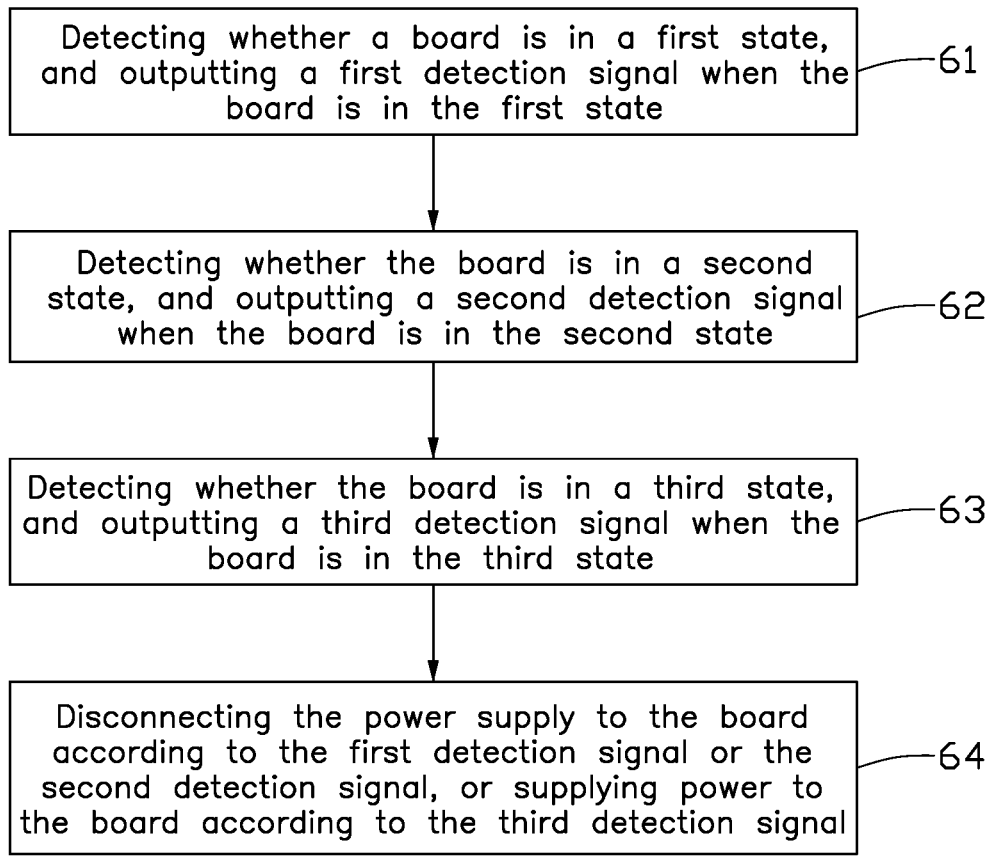
FIG. 6 is a flowchart of a board mis-insertion prevention method according to an embodiment of the present disclosure.

FIG. 6 is a flowchart depicting an embodiment of a board mis-insertion prevention method.

Each block shown in FIG. 6 represents one or more processes, methods, or subroutines, carried out in the example method. Furthermore, the illustrated order of blocks is illustrative only and the order of the blocks can change. Additional blocks can be added or fewer blocks may be utilized, without departing from the present disclosure. The example method can begin at block 61.

At block 61, detecting whether a board is in a first state, and outputting a first detection signal when the board is in the first state.

The first state may include the state in which the board 10 of the second type is inserted into the connector 20. The present disclosure can determine whether the board 10 is of the second type through the voltage level of the fifth port D2. The board 10 of the second type is grounded at the position corresponding to the fifth port D2. If the board 10 of the second type is stably inserted into the connector 20, the voltage level of the fifth port D2 is low level. The present disclosure can determine that the board 10 of the second type is stably inserted according to the low voltage level of the fifth port D2, and output the first detection signal.

At block 62, detecting whether the board is in a second state, and outputting a second detection signal when the board is in the second state.

The second state includes the state that the board 10 is not inserted into the connector 20. The present disclosure can determine whether the board 10 is inserted into the connector 20 through the voltage level of the second port P0. The positions of the first type of the board 10 corresponding to the fourth port D1 and the fifth port D2 are suspended, and the positions of the fourth port D1 and the fifth port D2 are also suspended when the board 10 is not inserted. When the voltage level of the fifth port D2 is suspended, it is impossible to determine whether the board 10 is not inserted into the connector 20 or whether the board 10 of the first type is inserted into the connector 20.

When the board 10 is not inserted or the insertion is unstable, the voltage level of the second port P0 is still in the suspended state. The present disclosure can determine that the board 10 is not inserted or the insertion is unstable through the fifth port D2 and the second port P0 are in the suspended state and output the second detection signal.

At block 63, detecting whether the board is in a third state, and outputting a third detection signal when the board is in the third state.

The third state includes the state in which the board 10 of the first type is inserted into the connector 20. The position of the board 10 of the second type corresponds to the second port P0 is electrically connected to the position of the first port P1. When the board 10 of the second type is stably inserted into the connector 20, the voltage level of the second port P0 is in the low voltage level, the present disclosure can determine that the board 10 of the first type is inserted into the connector 20 through the fifth port D2 is in the suspended state and the second port P0 is in the low voltage level, and the third detection signal is output.

At block 64, disconnecting the power supply to the board according to the first detection signal or the second detection signal, or supplying power to the board according to the third detection signal.

In the embodiment, if the first detection signal or the second detection signal is received, it is determined that the type of the board 10 is wrong or not inserted at this time, and the control module 50 does not convert the first power signal into the second power signal, so as to disconnect the power supply to the board 10 from the power module 40. If the third detection signal is received, it is determined that the board 10 is correctly inserted at this time, and the control module 50 converts the first power signal into the second power signal, so that the power module 40 supplies power to the board 10.

Those of ordinary skill in the art should realize that the above embodiments are only used to illustrate the present disclosure, but not to limit the present disclosure. As long as they are within the essential spirit of the present disclosure, the above embodiments are appropriately made and changes fall within the scope of protection of the present disclosure.

What is claimed is:

1. A board mis-insertion prevention circuit comprising:
a first detection circuit configured to detect whether a board is in a first state and output a first detection signal when the board is in the first state;
a second detection circuit configured to detect whether the board is in a second state when the board is not in the first state, and output a second detection signal when the board is in the second state; and
a control module electrically connected to the first detection circuit and the second detection circuit, configured to receive the first detection signal or the second detection signal, and disconnect power supply to the board according to the first detection signal or the second detection signal;
wherein the first detection circuit comprises a first light emitting module and a fifth port, an anode of the first light emitting module is electrically connected to the fifth port and the control module, and a cathode of the first light emitting module is connected to a second power supply.

2. The board mis-insertion prevention circuit of claim 1, wherein the second detection circuit is configured to detect whether the board is in a third state, when the board is in the third state, the second detection circuit outputs a third detection signal, and the control module is configured to receive the third detection signal and supply power to the board according to the third detection signal.

3. The board mis-insertion prevention circuit of claim 2, wherein the board is connected to a connector, and the first state comprises a state that the board of a second type is inserted into the connector, the second state comprises a state that the board is not inserted into the connector, and the third state comprises a state that the board of a first type is inserted into the connector.

4. The board mis-insertion prevention circuit of claim 2, wherein the control module is electrically connected to a power module, and the control module converts a first power signal output by the power module into a second power signal according to the third detection signal, and outputs the second power signal to the board to supply power to the board.

5. The board mis-insertion prevention circuit of claim 1, wherein the second detection circuit comprises a switch, a first end of the switch is electrically connected to a second port, a second end of the switch is electrically connected to the control module and a first power supply, a third end of the switch is grounded, the control module is electrically connected to a third port, and the control module supplies power to the board through the third port.

6. The board mis-insertion prevention circuit of claim 3, wherein the first detection circuit further comprises a second light emitting module, an anode of the second light emitting module is electrically connected to a fourth port, and a cathode of the second light emitting module is grounded.

7. The board mis-insertion prevention circuit of claim 6, wherein when the board is in the first state, the fifth port is in a first voltage level; when the board is in the second state, the fifth port and the second port are in a second voltage level; when the board is in the third state, the fifth port is in the second voltage level, and the second port is in the first voltage level.

8. A server system comprising:
   a motherboard;
   a power module electrically connected to the motherboard, and configured to supply power to the motherboard;
   a board mis-insertion prevention circuit comprising:
      a first detection circuit configured to detect whether a board is in a first state and output a first detection signal when the board is in the first state;
      a second detection circuit configured to detect whether the board is in a second state when the board is not in the first state, and output a second detection signal when the board is in the second state; and
      a control module electrically connected to the first detection circuit and the second detection circuit, configured to receive the first detection signal or the second detection signal, and disconnect power supply to the board according to the first detection signal or the second detection signal;
   wherein the first detection circuit comprises a first light emitting module and a fifth port, an anode of the first light emitting module is electrically connected to the fifth port and the control module, and a cathode of the first light emitting module is connected to a second power supply.

9. The server system of claim 8, wherein the second detection circuit is configured to detect whether the board is in a third state, when the board is in the third state, the second detection circuit outputs a third detection signal, and the control module is configured to receive the third detection signal and supply power to the board according to the third detection signal.

10. The server system of claim 9, wherein the board is connected to a connector, and the first state comprises a state that the board of a second type is inserted into the connector, the second state comprises a state that the board is not inserted into the connector, and the third state comprises a state that the board of a first type is inserted into the connector.

11. The server system of claim 9, wherein the control module is electrically connected to a power module, and the control module converts a first power signal output by the power module into a second power signal according to the third detection signal, and outputs the second power signal to the board to supply power to the board.

12. The server system of claim 8, wherein the second detection circuit comprises a switch, a first end of the switch is electrically connected to a second port, a second end of the switch is electrically connected to the control module and a first power supply, a third end of the switch is grounded, the control module is electrically connected to a third port, and the control module supplies power to the board through the third port.

13. The server system of claim 10, wherein the first detection circuit further comprises a second light emitting module, an anode of the second light emitting module is electrically connected to a fourth port, and a cathode of the second light emitting module is grounded.

14. The server system of claim 13, wherein when the board is in the first state, the fifth port is in a first voltage level; when the board is in the second state, the fifth port and the second port are in a second voltage level; when the board is in the third state, the fifth port is in the second voltage level, and the second port is in the first voltage level.

* * * * *